US009504168B2

(12) United States Patent
Nagarajan et al.

(10) Patent No.: US 9,504,168 B2
(45) Date of Patent: Nov. 22, 2016

(54) FLUXING-ENCAPSULANT MATERIAL FOR MICROELECTRONIC PACKAGES ASSEMBLED VIA THERMAL COMPRESSION BONDING PROCESS

(75) Inventors: Sivakumar Nagarajan, Chandler, AZ (US); Sandeep Razdan, Chandler, AZ (US); Nisha Ananthakrishnan, Chandler, AZ (US); Craig J. Weinman, Mesa, AZ (US); Kabirkumar J. Mirpuri, Scottsdale, AZ (US)

(73) Assignee: Intel Corporation

( * ) Notice: Subject to any disclaimer, the term of this patent is extended or adjusted under 35 U.S.C. 154(b) by 284 days.

(21) Appl. No.: 13/994,674

(22) PCT Filed: Sep. 30, 2011

(86) PCT No.: PCT/US2011/054389
§ 371 (c)(1),
(2), (4) Date: Jun. 14, 2013

(87) PCT Pub. No.: WO2013/048473
PCT Pub. Date: Apr. 4, 2013

(65) Prior Publication Data
US 2013/0263446 A1    Oct. 10, 2013

(51) Int. Cl.
*H05K 3/28* (2006.01)
*H05K 3/34* (2006.01)
(Continued)

(52) U.S. Cl.
CPC ............. *H05K 3/3489* (2013.01); *C08G 59/42* (2013.01); *C08L 63/00* (2013.01); *C09J 5/06* (2013.01); *H01L 21/56* (2013.01); *H01L 24/29* (2013.01);
(Continued)

(58) Field of Classification Search
CPC .................................................. H05K 3/3489

USPC .......... 29/840, 841, 832, 739, 740, 743, 830
See application file for complete search history.

(56) References Cited

U.S. PATENT DOCUMENTS 5,985,456 A * 11/1999 Zhou .................... B23K 35/025
                                                          148/24
6,180,696 B1 * 1/2001 Wong ..................... C08G 59/42
                                                        257/E21.503
(Continued)

FOREIGN PATENT DOCUMENTS

JP      2003-332381 A    11/2003
TW      200834878 A      8/2008

OTHER PUBLICATIONS

Bao, et al., "No Flow Underfill with Novel Fluxes," 2006 Electronic Components and Technology Conference, IEEE, 2006, pp. 474-478.
(Continued)

*Primary Examiner* — Peter DungBa Vo
*Assistant Examiner* — Kaying Kue
(74) *Attorney, Agent, or Firm* — Blakely, Sokoloff, Taylor & Zafman LLP

(57) ABSTRACT

A fluxing-encapsulant material and method of use thereof in a thermal compression bonding (TCB) process is described. In an embodiment, the TCB process includes ramping the bond head to 250° C.-300° C. at a ramp rate of 50° C./second-100° C./second. In an embodiment, the fluxing-encapsulant material comprising one or more epoxy resins having an epoxy equivalent weight (EEW) of 150-1,000, a curing agent, and a fluxing agent having a mono-carboxylic acid or di-carboxylic acid and a pKa of 4-5.

12 Claims, 11 Drawing Sheets

(51) Int. Cl.
- H01L 23/00 (2006.01)
- H01L 21/56 (2006.01)
- C08G 59/42 (2006.01)
- C09J 5/06 (2006.01)
- C08L 63/00 (2006.01)

(52) U.S. Cl.
CPC .............. *H01L 24/75* (2013.01); *H01L 24/81* (2013.01); *H01L 24/83* (2013.01); *C09J 2203/326* (2013.01); *C09J 2463/00* (2013.01); *H01L 24/05* (2013.01); *H01L 24/13* (2013.01); *H01L 24/16* (2013.01); *H01L 24/32* (2013.01); *H01L 24/73* (2013.01); *H01L 2224/0401* (2013.01); *H01L 2224/05624* (2013.01); *H01L 2224/05647* (2013.01); *H01L 2224/13109* (2013.01); *H01L 2224/13111* (2013.01); *H01L 2224/13116* (2013.01); *H01L 2224/16145* (2013.01); *H01L 2224/16225* (2013.01); *H01L 2224/2929* (2013.01); *H01L 2224/29386* (2013.01); *H01L 2224/32145* (2013.01); *H01L 2224/32225* (2013.01); *H01L 2224/73204* (2013.01); *H01L 2224/75251* (2013.01); *H01L 2224/75252* (2013.01); *H01L 2224/81191* (2013.01); *H01L 2224/81192* (2013.01); *H01L 2224/81204* (2013.01); *H01L 2224/81424* (2013.01); *H01L 2224/81447* (2013.01); *H01L 2224/83192* (2013.01); *H01L 2224/83862* (2013.01); *H01L 2224/92143* (2013.01); *H01L 2224/94* (2013.01); *H01L 2225/06513* (2013.01); *H01L 2924/01029* (2013.01); *H01L 2924/01327* (2013.01); *H05K 3/3436* (2013.01); *H05K 3/3494* (2013.01); *Y10T 29/49144* (2015.01); *Y10T 29/49146* (2015.01)

(56) References Cited

U.S. PATENT DOCUMENTS

| | | | | |
|---|---|---|---|---|
| 6,214,642 B1* | 4/2001 | Chen | ................ | H01L 21/4853 257/780 |
| 6,333,206 B1* | 12/2001 | Ito | ................ | H01L 24/83 257/686 |
| 6,335,571 B1* | 1/2002 | Capote | ................ | B23K 35/025 257/737 |
| 6,367,150 B1* | 4/2002 | Kirsten | ................ | B23K 35/3613 156/182 |
| 6,458,472 B1* | 10/2002 | Konarski | ................ | B23K 35/3612 148/25 |
| 6,555,414 B1* | 4/2003 | Vanfleteren | ................ | H01L 21/563 257/E21.503 |
| 6,739,497 B2* | 5/2004 | Fortin | ................ | H05K 3/305 228/215 |
| 6,800,169 B2* | 10/2004 | Liu | ................ | B32B 7/12 156/292 |
| 6,819,004 B2* | 11/2004 | Kirsten | ................ | B23K 35/025 257/778 |
| 7,087,458 B2* | 8/2006 | Wang | ................ | H01L 21/563 257/E21.503 |
| 7,109,061 B2* | 9/2006 | Crane | ................ | H01L 21/563 257/783 |
| 7,538,022 B2* | 5/2009 | Kurita | ................ | H01L 21/563 257/E21.507 |
| 7,564,139 B2* | 7/2009 | Kuwabara | ................ | H01L 24/81 257/778 |
| 8,669,137 B2* | 3/2014 | Nah | ................ | H01L 21/563 257/E21.502 |
| 8,963,340 B2* | 2/2015 | Feger | ................ | H01L 23/544 257/778 |
| 2003/0174273 A1 | 9/2003 | Matsui et al. | | |
| 2003/0176599 A1* | 9/2003 | Kirsten | ................ | B23K 35/025 525/523 |
| 2003/0209590 A1* | 11/2003 | Fortin | ................ | H05K 3/305 228/180.22 |
| 2005/0218195 A1* | 10/2005 | Wilson | ................ | B23K 35/3613 228/180.22 |
| 2006/0068521 A1 | 3/2006 | Shi et al. | | |
| 2006/0199301 A1* | 9/2006 | Basheer | ................ | B82Y 30/00 438/106 |
| 2009/0229123 A1 | 9/2009 | Sakai et al. | | |
| 2010/0102446 A1 | 4/2010 | Katsurayama et al. | | |
| 2011/0159228 A1 | 6/2011 | Swaminathan et al. | | |

OTHER PUBLICATIONS

Kim, et al., "No-Flow Underfill Process Optimization for High Yield and Reliability in Flip Chip Assembly," 8$^{th}$ International Symposium on Advanced Packaging Materials, IEEE, 2002, pp. 271-277.

Lee, Ning-Cheng, "Solder Paste Technology" Reflow Soldering Processes, 2001, pp. 37-55.

PCT International Search Report and Written Opinion for International Application No. PCT/US2011/054389, mailed May 18, 2012, 8 pages.

Office Action issued by the Examiner of the Intellectual Property Office (IPO) dated Aug. 14, 2015 for Taiwan Patent Application No. 101130836 and English Translation thereof.

* cited by examiner

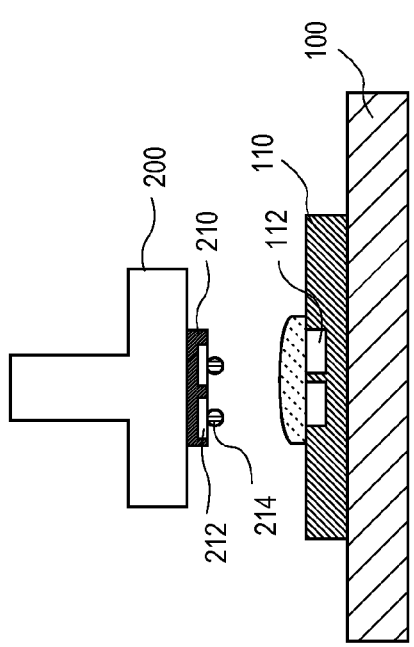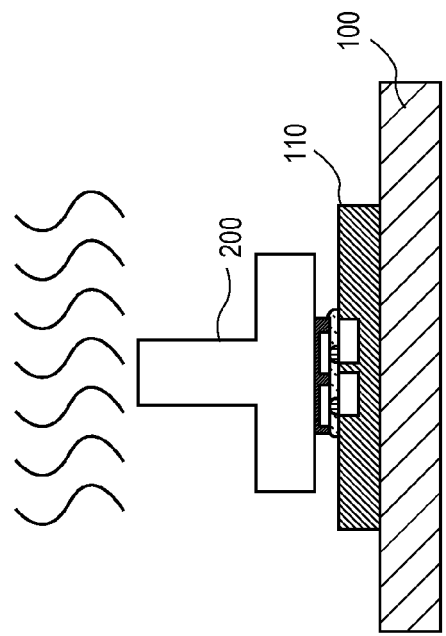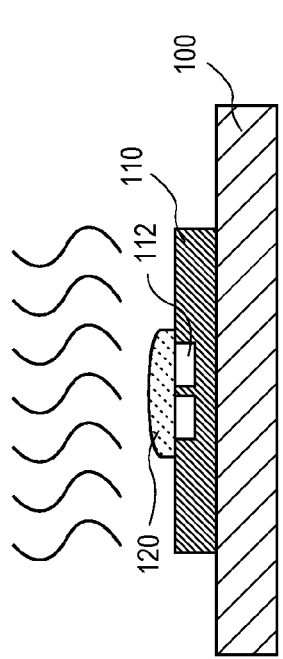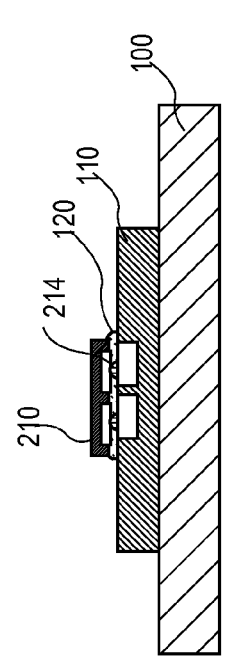

FLUXING-ENCAPSULANT MATERIAL FOR MICROELECTRONIC PACKAGES ASSEMBLED VIA THERMAL COMPRESSION BONDING PROCESS

CROSS-REFERENCE TO RELATED APPLICATION

This patent application is a U.S. National Phase application under 35 U.S.C. §371 of International Application No. PCT/US2011/054389, filed Sep. 30, 2011, entitled FLUXING-ENCAPSULANT MATERIAL FOR MICROELECTRONIC PACKAGES ASSEMBLED VIA THERMAL COMPRESSION BONDING PROCESS.

BACKGROUND OF THE INVENTION

1. Field of the Invention

The present invention relates to microelectronic packaging, and more particularly, a fluxing-encapsulant material and use thereof in a thermal compression bonding process.

2. Discussion of Related Art

The ongoing trend toward increased performance and higher density electrical circuits has led to the development of surface mount technology in the design of electronic packages and printed circuit boards (PCBs). Thermal compression bonding (TCB) has gained wide acceptance within the electronic packaging industry to bond a top substrate directly onto a bottom substrate with solder bumps that are reflowed under elevated temperature and pressure to form joints. For example, thermal compression bonding may be used for bonding die-to-die, die-to-substrate carrier, die-to-package and die-to-wafer.

Several implementations of thermal compression bonding are utilized in industry. In a first implementation a fluxing material is applied prior to or during thermal compression bonding to reduce oxides on the joints. An encapsulant is then dispensed after thermal compression bonding to provide mechanical protection for the joints. In the first implementation a deflux process may be required prior to dispensing the encapsulant to wash off flux residues. The joints are unprotected during the deflux process. Voiding and reliability failures may result due to inefficient defluxing associated with tight bump pitches as well as the joints being unprotected during the deflux process.

A second implementation limits the surface finish of the bond pads to materials which do not readily oxidize. In this implementation the use of a fluxing material may be eliminated and the joints are formed without a flux material. An encapsulant may be dispensed during or after thermal compression bonding to provide mechanical protection for the joints. Poor joint quality and voiding may result due to contamination on the bond pads and partial non-wets associated with not fluxing solder oxide.

In a third implementation a no-flow underfill process is used for thermal compression bonding in which an underfill possessing self-fluxing capability is cured during the solder reflow process. However, current no-flow underfill processes are plagued with several failure modes. For example, non-wetting of bond pad and solder metallurgies including copper, nickel, etc. is commonly experienced due to insufficient fluxing action of the no-flow underfill type material. Significant voiding is also observed due to the incompatability of the no-flow underfill type material and cure kinetics of the no-flow underfill type material with fast ramp TCB thermal profiles. This voiding can also lead to joint cracks and insufficient thermomechanical protection of the cured underfill.

BRIEF DESCRIPTION OF THE DRAWINGS

FIGS. 3A-3D are side view illustrations of a thermal compression bonding process in accordance with embodiments of the invention.

DETAILED DESCRIPTION OF THE PRESENT INVENTION

Figure 1:
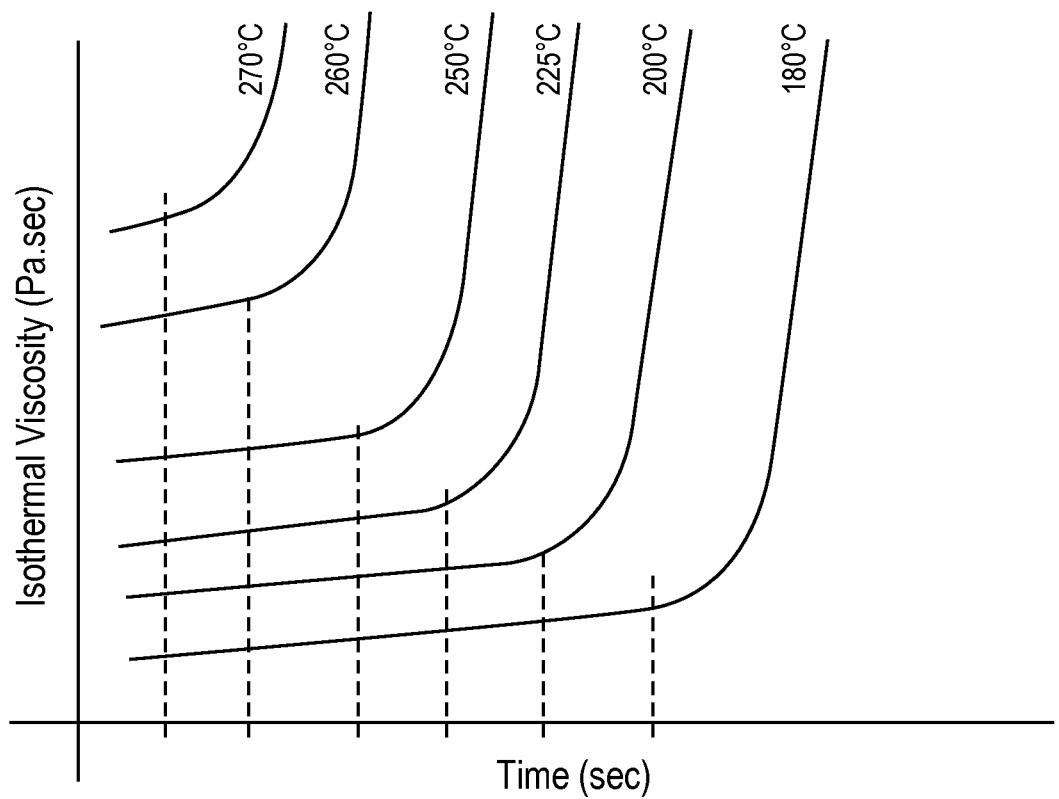
FIG. 1 is an isothermal viscosity plot for a fluxing-encapsulant material at various temperatures between staging and bonding steps in a thermal compression bonding process in accordance with embodiments of the invention.

In various embodiments, a fluxing-encapsulant material and method of thermal compression bonding are described with reference to figures. However, certain embodiments may be practiced without one or more of these specific details, or in combination with other known methods and materials. In the following description, numerous specific details are set forth, such as specific materials, percentages and processes, etc. in order to provide a thorough understanding of the present invention. In other instances, well-known packaging processes and manufacturing techniques have not been described in particular detail in order to not unnecessarily obscure the present invention. Reference throughout this specification to "an embodiment" or "one embodiment" means that a particular feature, structure, material, or characteristic described in connection with the embodiment is included in at least one embodiment of the invention. Thus, the appearances of the phrase "in an embodiment" or "in one embodiment" in various places throughout this specification are not necessarily referring to the same embodiment of the invention. Furthermore, the particular features, structures, materials, or characteristics may be combined in any suitable manner in one or more embodiments.

In accordance with embodiments of the present invention, a fluxing-encapsulant material is described which may be compatible with a fast ramp thermal compression bonding (TCB) process, capable of reducing oxides of different bond pad and solder metallurgies including, but not limited to, copper, nickel, cobalt, tin, gold, etc. and capable of encapsulating and protecting the joints from cracking during assembly and reliability stresses.

In one aspect, the fluxing-encapsulant material may be compatible with TCB processes for die-to-die, die-to-substrate carrier, die-to-package, die-to-wafer and wafer-to-wafer assembly. As used herein the term "substrate" is used as a general term and may be inclusive of any of a die, substrate carrier, package, wafer, etc.

In one aspect, the fluxing-encapsulant material may reduce surface finish oxides and also provide bump encapsulation in a single step, during TCB process.

In one aspect, the fluxing-encapsulant material may include at least one fluxing agent specific to reducing oxides of various metallurgies such as, but not limited to, copper, nickel, cobalt, tin, gold, etc.

In one aspect, the fluxing-encapsulant material may be able to flow and fill tight bump pitches less than 100 microns.

In one aspect, the fluxing-encapsulant material may be able to flow and fill small chip gaps less than 50 microns.

In an embodiment of the present invention, a fluxing-encapsulant material and manner of use thereof in a fast ramp thermal compression bonding (TCB) process is described. In such an embodiment, the fluxing-encapsulanet material is dispensed onto a bottom substrate which is secured to a pedestal. The bottom substrate may be held a staging temperature of 180° C., for example. A top substrate is secured to a bond head, which may also be held at a staging temperature of 100° C., for example. The top substrate is then placed onto the bottom substrate. The bond head temperature is then ramped to a temperature (e.g. 250° C.-300° C.) which is above the liquidus temperature of solder bumps located on either the top or bottom substrate at a fast ramp rate of 50° C./second-100° C./second. The bond head temperature is then maintained for a time above the liquidus temperature of the solder (TAL), and the bond head temperature is then reduced to a temperature (e.g. 180° C.) which is below the liquidus temperature of the solder.

In an embodiment, the fluxing-encapsulant material may include one or more epoxy resins having multiple functional groups and an epoxy equivalent weight (EEW) of 150-1,000, a curing agent having a functional group such as an anhydride, acid, and amine, and a mono-carboxylic acid or di-carboxylic acid fluxing agent having an acid dissociation constant (pKa) of 4-5. As used herein, pKa refers to the only or the first acid dissociation constant. With regard to polyprotic acids, pKa refers to the first acid dissociation constant $pK_1$, and not $pK_2$, $pK_3$, etc. The fluxing-encapsulant may additionally include a filler having a surface coating which is non-reactive with the multiple functional groups of the epoxy resin. Additional additives may be included in the fluxing-encapsulant material as required by the TCB process and package requirements.

In an embodiment, a fluxing-encapsulant material exhibiting slow cure kinetics is utilized in a fast ramp TCB process in order to achieve reduced or void-free encapsulation. In such an embodiment, the combination of high molecular weight epoxies having an EEW of 150-1,000 or more specifically 300-1,000, and even more specifically between 300 and 500 with slow curing kinetics of the curing agent such as an anhydride, or more specifically a cyclic anhydride, which does not react very fast at temperatures lower than 180° C. allows the incorporation of stronger or higher concentrations of organic fluxing agents such as mono-carboxylic and di-carboxylic acids into the fluxing-encapsulant material. In this manner, the epoxy resin may need to only be cured enough by the end of the time above liquidus (TAL) of the solder to protect the joints during cool down. The substantially incomplete curing during the TAL allows for an escape route for the volatiles which are generated during TCB. The epoxy can be final cured during subsequent heat treatments.

The cure kinetics of the fluxing-encapsulant material may be tuned in such a way that the fluxing-encapsulant material possesses a high resistance to cure at or below the staging temperatures. At the staging temperature of 180° C., for example, the fluxing-encapsulant material retains a low viscosity for a reasonable amount of time (≥125 seconds). At temperatures above the staging temperature the fluxing-encapsulant material may start to cure faster and in turn the viscosity increases faster. A schematic illustration of isothermal viscosity traces for a fluxing-encapsulant material in accordance with embodiments of the present invention is provided in FIG. 1. As the temperature increases from staging to bonding temperatures, the low viscosity regime shortens and the fluxing-encapsulant material begins to cure at a faster rate upon reaching the inflection point illustrated by the dotted lines. Maintaining a longer low viscosity window prior to reaching the inflection point during the staging and bonding temperatures may better enable the spreadability and flowability of the fluxing-encapsulant material thereby lowering the tendency to entrap voids, fillers and resin.

Thus, in accordance with embodiments of the invention a slow curing fluxing-encapsulant material may be implemented into fast ramp TCB process in which the amount of volatiles created is reduced, while at the same time the slow curing kinetics may allow for the escape of volatiles generated resulting in minimal or no voiding. In addition, the slow curing kinetics allows the incorporation of stronger or higher concentrations of organic fluxing agents such as mono-carboxylic and di-carboxylic acids into the fluxing-encapsulant material so that the presence of non-wets is reduced or eliminated. The stronger or higher concentrations of organic fluxing agents also may enable fluxing of a variety of surface finishes, including those which commonly are associated with difficult to remove oxides, such as, but not limited to, copper and nickel.

Figure 2:
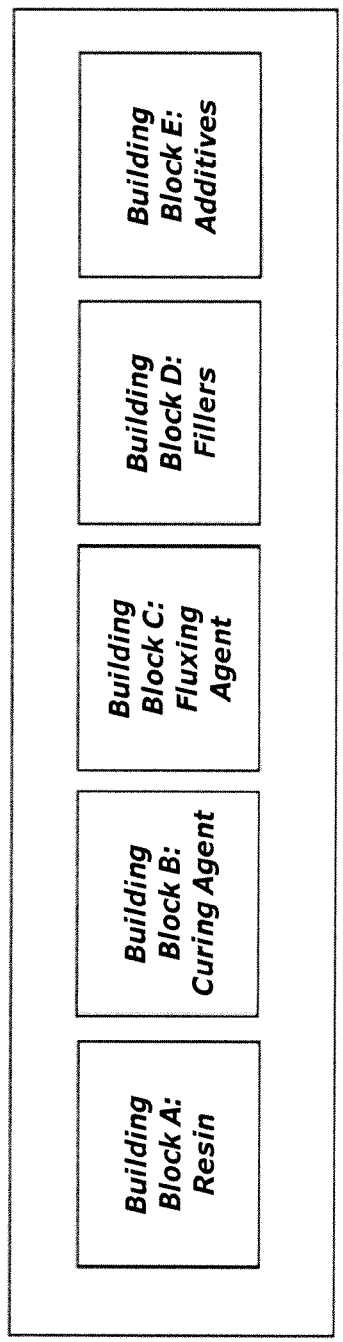
FIG. 2 is an illustration of building blocks in a fluxing-encapsulant material in accordance with embodiments of the invention.
Figure 4:
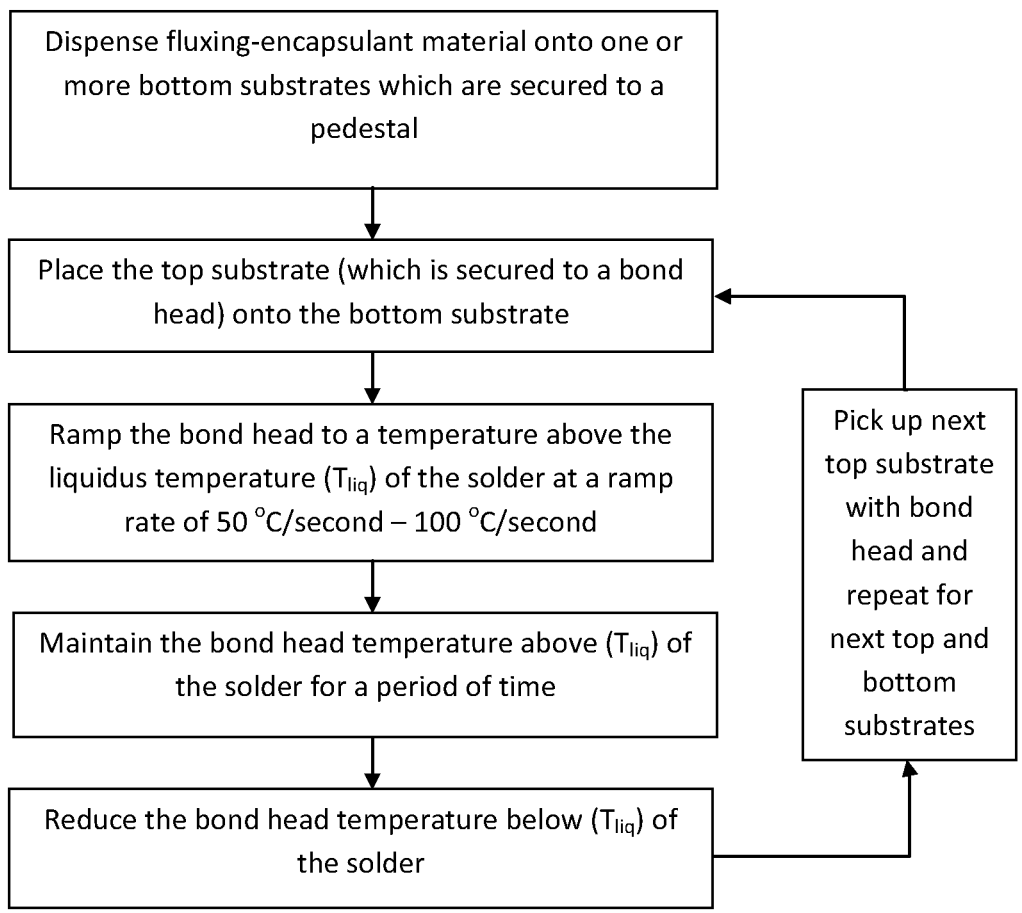
FIG. 4 is an illustration of a thermal compression bonding process in accordance with embodiments of the invention.

Referring to FIG. 2, a combination of building blocks of the fluxing-encapsulant material is illustrated in which the combination may enable void-free encapsulation during a fast ramp TCB process. In accordance with embodiments of the present invention, the resin building block includes one or more an epoxy resins having multiple functional groups and an epoxy equivalent weight (EEW) of 150-1,000 to enable minimal or no voiding and the passing of reliability conditions that must be met such as temperature cycling. The multiple functional groups provide multiple sites for reaction when the curing agent is activated. For example, the epoxy resin may be a di-functional epoxy resin or tri-functional epoxy resin, and mixtures thereof. The higher EEW may reduce the amount of volatile generation from the epoxy resin. It has been found that resins with an EEW lower than about 150 may exhibit greater volatilization during the TCB thermal profile leading to voids. The one or more epoxy resins may constitute 20 weight %-30 weight % of the overall fluxing-encapsulant material in an embodiment. In a certain embodiment, the epoxy resin may be diglycidyl ether of bis-phenol A (DGEBA), also commonly known as BADGE, with two functional epoxy groups. DGEBA has the following structure:

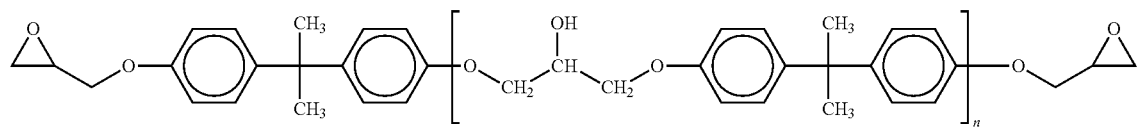

In accordance with embodiments of the present invention, the curing agent building block includes one or more curing agents having an anhydride, acid or amine functional group to enable delayed gelation during the TCB fast ramp to peak reflow temperature. If high cure speed and higher throughput are desired then an acid curing agent may be provided in the fluxing-encapsulant material to accelerate cure kinetics after being activated to reach a substantially complete cure of the epoxy resin by the end of the TCB process. If achieving a void-free or substantially void-free encapsulation is desired then a curing agent with slower cure kinetics with the epoxy resin may be provided in the fluxing-encapsulant material. For example, anhydride and amine curing agents may have slower cure kinetics than acid curing agents.

In an embodiment, void-free encapsulation is achieved with a slow curing formulation in which the volatiles generated from the building blocks of the fluxing-encapsulant material and volatiles generated due to fluxing reactions can be released if the viscosity and cure speed of the fluxing-encapsulant material is low. In this manner, the epoxy resin may need to only be cured enough at the end of the time above liquidus (TAL) of the solder (such as 5-60 seconds, more specifically 5-40 secons, and even more specifically 5-20 seconds) to protect the joints during cool down. The fluxing-encapsulant can be final cured in a process after reducing the substrates below the solder liquidus temperature. The substantially incomplete curing after gelation of the fluxing-encapsulant material may allow for the release of volatiles generated during solder reflow, fluxing and initial curing of the fluxing-encapsulant material, which reduces the formation of voids.

The one or more curing agents may constitute 2 weight % to 20 weight % of the overall fluxing-encapsulant material in an embodiment. Exemplary anhydrides include ethanoic anhydride (acetic anhydride) having a melting point of −73° C., a boiling point of 140° C. and the following structure:

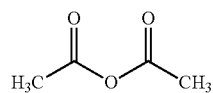

propanoic anhydride (propionic anhydride) having a melting point of −45° C., a boiling point of 168° C. and the following structure:

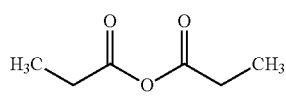

butanoic anhydride (butyric anhydride) having a having a melting point of −75° C., a boiling point of 200° C. and the following structure:

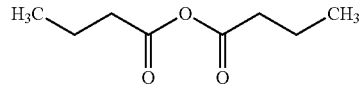

succinic anhydride having a melting point of 120° C., a boiling point of 261° C. and the following structure:

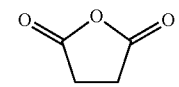

glutaric anhydride having a melting point of 57° C. and the following structure:

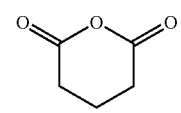

benzoic anhydride having a melting point of 42° C., a boiling point of 360° C. and the following structure:

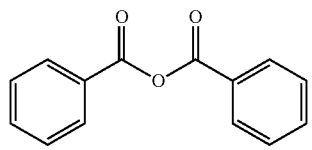 [SMILES: O=C(OC(=O)c1ccccc1)c1ccccc1]

and phlatic anhydride (tetrahydrophthalic anhydride) having a melting point of 132° C., a boiling point of 285° C. and the following structure:

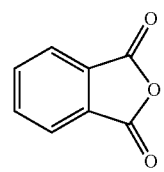 [SMILES: O=C1OC(=O)c2ccccc21]

In an embodiment, suitable curing agents may include, but are not limited to, cyclic anhydrides such as succinic anhydride, benzoic anhydride and phthalic anhydride and their hydrogenated versions such as tetrahydropthalic anhydrides and hexahydropthalic anhydrides.

In accordance with embodiments of the present invention, the fluxing agent building block includes one or more fluxing agents to reduce oxides present on the metallic surface finish of the bond pads and solder. The type and concentration of fluxing agents added to the fluxing-encapsulant material may determine the oxide removal capabilities of the fluxing-encapsulant material for a given surface finish. Hence with the appropriate fluxing action the occurrence of non-wets in the joints may be eliminated. The one or more fluxing agents may constitute 5 weight %-30 weight % of the overall fluxing-encapsulant material in an embodiment.

Fluxing agents such as organic carboxylic acids, Lewis acids, fatty acids and rosins may be used. Of particular importance when selecting the fluxing agent is recognizing that in addition to the oxide removal capabilities of a particular fluxing agent, the particular fluxing agent may also have the potential to act as a curing agent for a particular resin since it is possible that the functional groups present in the fluxing agent may also initiate a cross linking reaction, impact gelation, and affect the cure kinetics of the resin. Accordingly, in certain embodiments of the present invention the interaction of the fluxing agent with the epoxy resin is carefully modulated. In an embodiment, the reactivity of the fluxing agent with the epoxy resin may be tempered by a fast ramp rate, as well as the delayed activity of the fluxing agent. In an embodiment, the fluxing agent is active with respect to the oxides to be removed, and at the same time not substantially reactive with the epoxy resin. In an embodiment, reaction byproducts of the fluxing agent do not phase separate from the cured epoxy network. In some embodiments, any fluxing reactions and the resultant reaction byproducts occur before ramping the fluxing encapsulant material to 250° C.-300° C. In some embodiments, any degradation related to volatilization of the fluxing agent may also occur before ramping the fluxing encapsulant to 250° C.

In accordance with embodiments of the present invention, the fluxing-encapsulant material may be capable of removing copper oxide layers of 50 nm-125 nm in thickness from copper bond pads. In a strip-based TCB application it is often typical for 60-70 substrates, for example, to be placed on a bottom pedestal at an elevated staging temperature (e.g. 180° C.) for a period of one hour or more. It has been observed that, during this time, the last substrate in the strip to be bonded may accumulate more oxide growth on its metallic surface finish than the first substrate in the strip to be bonded. In accordance with embodiments of the present invention the fluxing agents may be aggressive enough to remove 50 nm-125 nm in thickness from copper bond pads. In a particular embodiment, the one or more fluxing agents may include mono-carboxylic acids or di-carboxylic acids, or a mixture thereof, with an acid dissociation constant (pKa) of 4-5 in order to remove the copper oxide layers that may have formed. The one or more mono-carboxylic acids and/or di-carboxylic acids may constitute 5 weight %-30 weight % of the overall fluxing-encapsulant material in an embodiment.

In certain embodiments, the fluxing agent may include, but is not limited to, succinic acid ($pK_1$=4.207), adipic acid ($pK_1$=4.418), pimelic acid ($pK_1$=4.484), suberic acid ($pK_1$=4.512), azelaic acid ($pK_1$=4.53), sebacid acid ($pK_1$=4.59), benzoic acid ($pK_1$=4.204), and mixtures thereof.

In accordance with embodiments of the present invention, the fillers building block includes one or more fillers with a surface coating which is non-reactive to the epoxy resin so as to avoid premature gelation and curing of the epoxy resin. To minimize filler entrapment in the joints formed in a TCB process various aspects of the fillers may be controlled such as average particle size, maximum particle size, distribution, and surface coating. In certain embodiments, all of the fillers may include a non-reactive coating, only a percentage of the fillers include a non-reactive coating, or a combination of non-reactive coatings can be formed on the fillers. Fillers may be any material, such as silica, suitable for reduction of the coefficient of thermal expansion (CTE) and modulus of elasticity strengthening. In an embodiment, the fillers may comprise 60 weight %-70 weight % of the overall fluxing-encapsulant material. Such a high weight % may be beneficial for reduction of the coefficient of thermal expansion (CTE) of the cured encapsulant and for modulus of elasticity strengthening. In an embodiment, the fillers have a particle size of less than 1 micron to 30 microns. In an embodiment, the fillers have a maxiumum particle size of less than 5 microns to minimize or eliminate filler entrapment in the joints. In a certain embodiment, the fillers may comprise silica particles with a non-reactive coating at 60 weight %-70 weight % of the overall fluxing-encapsulant material, and a maximum particle size less than 5 microns. An exemplary non-reactive coating may include silane coupling agents with functional groups that are non-reactive to epoxide rings.

In accordance with embodiments of the present invention, the fluxing-encapsulant material may additionally include the building block of additional additives as needed to modify the physical, mechanical, adhesion properties of the encapsulant as required by the TCB process and package requirements. These additives may include, but are not limited to, viscosity modifiers, coupling agents, adhesion promoters, tougheners, etc. The one or more additives may constitute 1 weight %-5 weight % of the overall fluxing-encapsulant material in an embodiment.

Referring now to FIGS. 3A-3D and FIG. 4 a method of thermal compression bonding is illustrated in accordance with embodiments of the present invention. As illustrated, a fluxing-encapsulant material 120 is dispensed onto one or more bottom substrates 110 which are secured to a pedestal 100. The bottom substrate(s) 110 (e.g. die, organic substrate, package, wafer, etc.) may be secured to the pedestal 100 under vacuum. A bond head 200 having a top substrate 210 secured thereto places the top substrate 210 onto a bottom substrate 110 with a bond force, such as 2 Newtons or higher. In accordance with embodiments of the invention, the top and bottom substrates may include metallic bond pads 112, 212. Solder bumps 214 may be attached to the bond pads 112, 212 of either or both the top and bottom substrates. The solder may be any type of solder such as lead-tin, indium based, tin-copper, tin-copper-nickel, etc. The bond pads may be constructed from materials such as aluminum, copper, etc.

The bond head 200 may be preheated to an elevated staging temperature (e.g. 100° C.) which is below the liquidus temperature ($T_{liq}$) of the solder 214 either before or after picking up the top substrate 210 using a vacuum nozzle. In an embodiment, the bond head 200 idles at the elevated staging temperature and is maintained at the elevated staging temperature when picking up the top substrate 210 and when placing the top substrate 210 onto the bottom substrate 110. In addition the pedestal 100 may be preheated to an elevated staging temperature which is below the liquidus temperature ($T_{liq}$) of the solder 214 prior to placing the top substrate 210 onto the bottom substrate 110. In a certain embodiment, the pedestal 100 is preheated to an elevated staging temperature of approximately 180° C. The fluxing-encapsulant material 120 may be dispensed onto the bottom substrate 110 either before preheating the substrate or immediately before placing the top substrate onto the bottom substrate, dependent on the cure behavior of the fluxing-encapsulant material. In one embodiment the fluxing-encapsulant material 120 is dispensed onto a plurality of substrates 110 on the pedestal 100 prior to preheating the pedestal to a staging temperature.

After placing the top substrate 210 onto the bottom substrate 110 the bond head 200 is ramped from the staging temperature to a temperature above the liquidus temperature ($T_{liq}$) of the solder 214 at a fast ramp rate of 75° C./second-100° C./second. The bond head temperature is then maintained for a period of time above the liquidus temperature (TAL) of the solder 214, and the temperature of the bond head is then reduced below the liquidus temperature of the solder 214 prior to releasing the second substrate 210. After releasing the second substrate 210 the process may be repeated for the bond head 200 for placing additional top substrates onto bottom substrates in a strip secured to the pedestal 100. Once all of the packages have been assembled, they may be removed from the pedestal 100 for off-line curing or kept on the pedestal at an elevated temperature in an in-line fashion to achieve 100% cure in the fluxing-encapsulant material.

Figure 5:
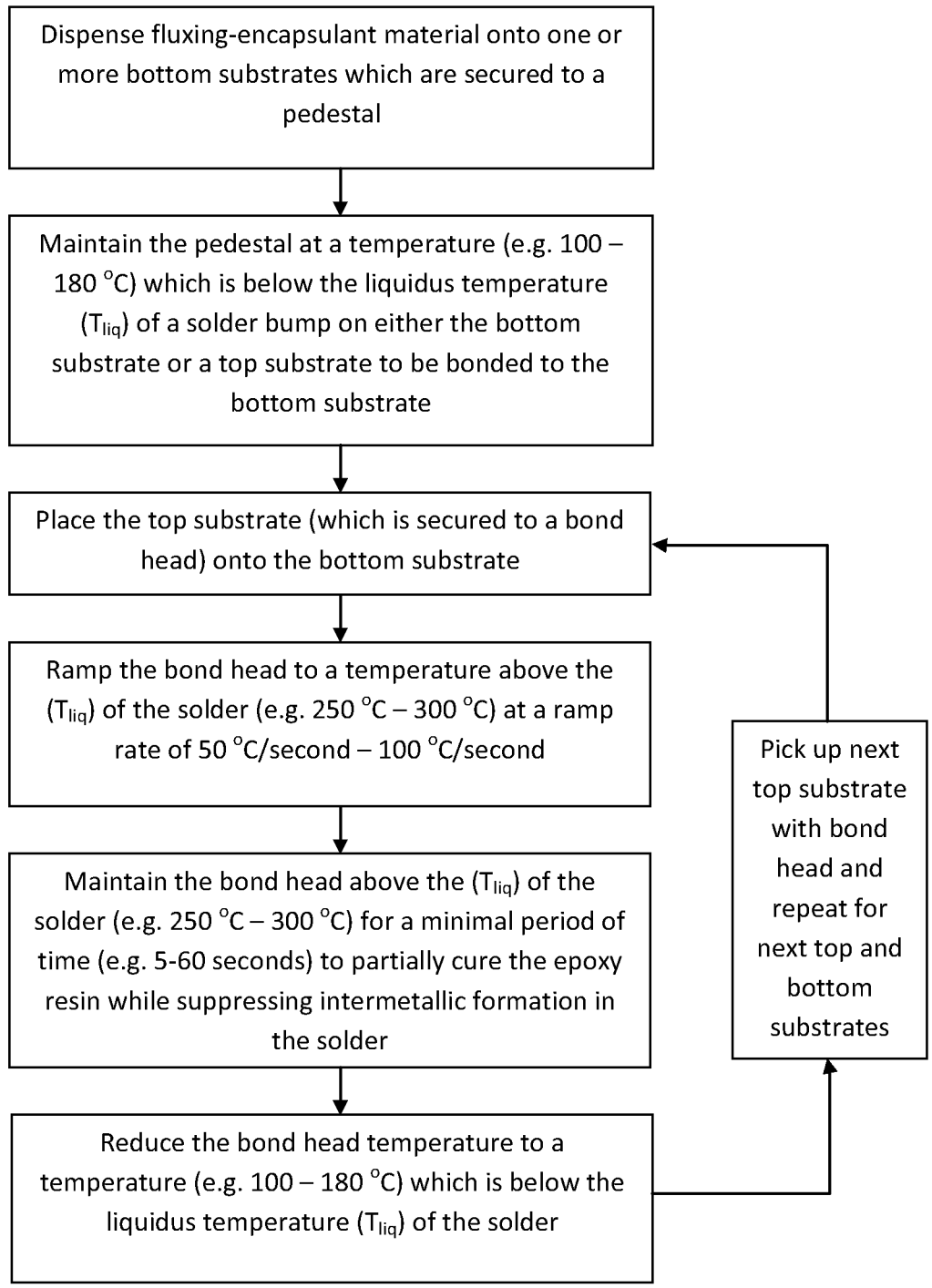
FIG. 5 is an illustration of a thermal compression bonding process in accordance with embodiments of the invention.

Referring now to FIG. 5 a method of thermal compression bonding is illustrated in accordance with embodiments of the present invention in which specific thermal interaction of the building blocks of the fluxing-encapsulant material is described. As illustrated, a fluxing-encapsulant material is dispensed onto one or more bottom substrates which are secured to a pedestal, for example under vacuum. The pedestal is maintained at an elevated staging temperature (e.g. 100° C.-180° C.) which is below the liquidus temperature ($T_{liq}$) of a solder bump on either the bottom substrate a top substrate secured to a bond head. The bond head may also be preheated to an elevated staging temperature (e.g. 100° C.-180° C.) which is below the liquidus temperature ($T_{liq}$) of the solder either before or after picking up the top substrate. The top substrate is placed onto the bottom substrate and then the bond head is ramped from the staging temperature to a temperature (e.g. 250-300° C.) which is above $T_{liq}$ of the solder at a ramp rate of 50° C./second-100° C./second such that the fluxing agent is activated between the preheat temperature (e.g. 100-180° C.) and the $T_{liq}$ of the solder.

The bond head temperature is then maintained at a temperature (e.g. 250° C.-300° C.) which is above the liquidus temperature of the solder 214 for a minimal period of time (e.g. 5-60 seconds, more specifically 5-40 seconds, or even more specifically 5-20 seconds) to partially cure the epoxy resin while suppressing the formation of intermetallic formation in the solder. Of particular significance is that, in accordance with embodiments of the present invention, it is not necessary that the fluxing-encapsulant material is completely cured during the time above liquidus (TAL) of the solder. In a specific embodiment, up to 40%-70% curing of the epoxy resin is achieved at the end of the period of time the bond head temperature is above the solder liquidus temperature (TAL).

The temperature of the bond head is then reduced to a temperature (e.g. 100° C.-180° C.) which is below the liquidus temperature of the solder prior to releasing the top substrate. After releasing the top substrate the process may be repeated for the bond head placing additional top substrates onto bottom substrates in a strip secured to the pedestal. Once all of the packages have been assembled, they may be removed from the pedestal for off-line curing or kept on the pedestal at an elevated temperature in an in-line fashion to achieve 100% cure in the fluxing-encapsulant material.

The following examples are provided in order to provide a more thorough understanding and illustration of the interrelation among the specific building blocks of the fluxing-encapsulant material and the ability of the fluxing-encapsulant material to be incorporated into a fast ramp TCB process. The following examples are provided for illustrational purposes, and are not meant to limit the scope of the present invention.

Example 1

0.05-2.0 grams of tetrahydrophthalic anhydride curing agent is added to 10 grams of DGEBA multifunctional epoxy having a high epoxy equivalent weight (EEW) of 300-500 and the mixture is stirred for about 2 hours at 50° C. until the curing agent is homogenously dissolved. The mixture is then cooled to 30° C.

0.025-1.0 grams of a mixture of mono-carboxyilic acid and di-carboxylic acid fluxing agent is added into the above mixture and stirred for 30 minutes at 50° C. This prepared formulation is called the base or unfilled formulation.

60-70 weight % of silica fillers is then added. The silica fillers have a surface coating including silane coupling agents with functional groups that are non-reactive to the epoxide rings of the epoxy resin. A glass rod is used to premix the silica fillers and base formulation. Then the mixture is passed through a three-roll mill machine six times to well disperse the silica particles in the base formulation. Average particle size of the silica fillers is 0.6 microns and the maximum size of the silica particles is 5 microns.

After roll-milling, the fluxing-encapsulant material is degassed in a vacuum oven for 1 hour and then stored in a freezer at −40° C. Prior to any evaluation, the fluxing-encapsulant material is thawed to room temperature for at least one hour.

The fluxing-encapsulant material is then used to bond a die to a package via TCB process. The pitch of the joints is as tight as approximately 40 microns and the gap (chip gap) between die and the package is as small as 25 microns.

In the TCB process, the fluxing-encapsulant material was dispensed onto the bottom package held under vacuum at a temperature of 180° C. The bottom package was then pre-baked at 180° C. for one hour in order to form a copper oxide layer on the copper bond pads of the bottom package in order to simulate oxide formation that may occur during a strip-based TCB process. A bond head heated to a staging temperature of 100° C.-180° C. picked up the die under vacuum. The die included copper-tin solder bumps. The bond head placed the die onto the package aligning the copper-tin solder bumps with the copper bond pads on the package. The bond head was then ramped from the staging temperature to a temperature of 250° C.-300° C. at a ramp rate of 50° C./second-100° C./second. The bond head was then kept stable at an isothermal temperature between 250° C.-300° C. for 5-40 seconds. The bond head was then rapidly cooled down in two stages. In the first stage the bond head cooled down to 150° C.-180° C. and kept at an isothermal temperature in the range for 20-60 minutes to cure the epoxy, with the second stage being cooling down to room temperature.

Figure 6A:
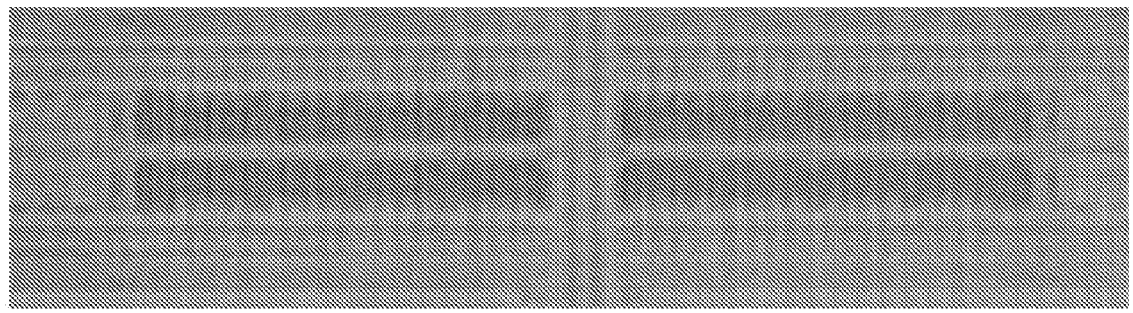
FIG. 6A is a scanning acoustic microscopy (SAM) top-down view to the joint depth of a TCB assembled package in accordance with embodiments of the invention.
Figure 6B:
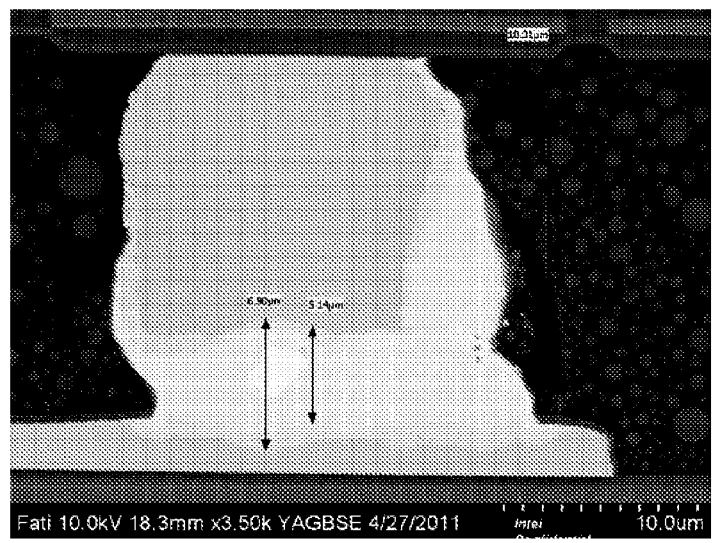
FIG. 6B is a side view of a joint and encapsulant of a TCB assembled package in accordance with embodiments of the invention.

FIG. 6A is a scanning acoustic microscopy (SAM) top-down view to the joint depth of the TCB assembled package of Example 1. As shown, no gross voiding is observed. FIG. 6B is a side-view of a joint and the encapsulant of the TCB assembled package of Example 1. FIG. 6B shows good fluxing action of the fluxing-encapsulant material for a copper finish, without the presence of non-wets and without any bump level voiding. It is believed that this was achieved by using the high molecular weight epoxies and slow curing kinetics of the fluxing-encapsulant material which allowed the incorporation of stronger/higher concentration of organic fluxing acids (mono-carboxylic and di-carboxylic acids). In addition, FIG. 6B illustrates good joint formation with no filler entrapment.

Example 2

A fluxing-encapsulant material is used to bond a die to a package via the same TCB process in Example 1. The fluxing-encapsulant material is the same material as described in Example 1 except that an epoxy having a lower EEW of less than 150 was used.

Figure 7:
FIGS. 7-8 are scanning acoustic microscopy (SAM) top-down views to the joint depth of TCB assembled packages in accordance with embodiments of the invention.

FIG. 7 is a scanning acoustic microscopy (SAM) top-down view to the joint depth of the TCB assembled package of Example 2. As shown, gross voiding is found in the cured encapsulant. It is believed that the volatiles produced from the low EEW epoxy resin was a contributing factor to the gross voiding.

Example 3

A fluxing-encapsulant material is used to bond a die to a package via the same TCB process in Example 1. The fluxing-encapsulant material is the same material as described in Example 1 except that a fast curing monofunctional aromatic carboxylic acid curing agent was used in place of the tetrahydrophthalic anhydride curing agent.

Figure 8:
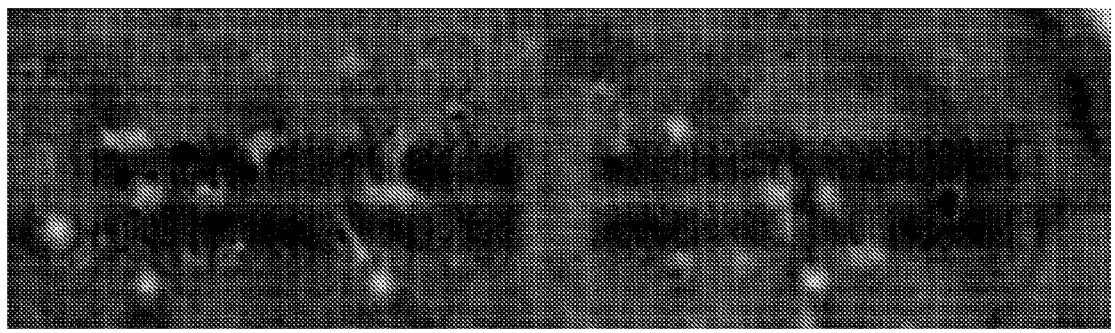

FIG. 8 is a scanning acoustic microscopy (SAM) top-down view to the joint depth of the TCB assembled package of Example 3. As shown, slight bump array voiding is found in the cured encapsulant. It is believed that the observed voiding is attributed to the faster curing kinetics resulting from the curing agent in Example 3, compared to the tetrahydrophthalic anhydride curing agent in Example 1.

Example 4

A fluxing-encapsulant material is used to bond a die to a package via the same TCB process in Example 1. The fluxing-encapsulant material is the same material as described in Example 1 except that very low concentration of a weak organic acid fluxing agent was used in place of the mixture of mono-carboxylic acid and di-carboxylic acid fluxing agent.

Figure 9:
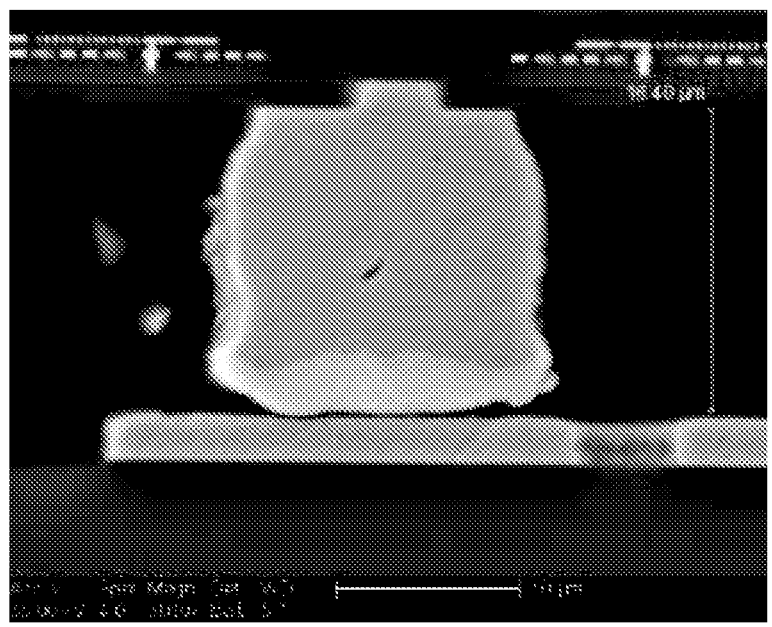
FIGS. 9-13 are side views of a joint and encapsulant of a TCB assembled package in accordance with embodiments of the invention.

FIG. 9 is a side-view of a joint and the encapsulant of the TCB assembled package of Example 4. As shown, gross non-wetting is observed between the copper-tin solder and the copper bond pad. It is believed that this is due to insufficient/weak fluxing action of the fluxing-encapsulant material in Example 4.

Examples 5-6

Filler entrapment is also a major issue during TCB process in the presence of a filled encapsulant material. In extreme cases, filler entrapment coupled with fast gelation/curing encapsulation systems can lead to non-touchdown issues. In accordance with embodiments of the present invention filler entrapment can be minimized or eliminated by tailoring the filler size and surface coating chemistry to reduce the interaction of the filler coating with the epoxy/curing agent system.

Figure 10:
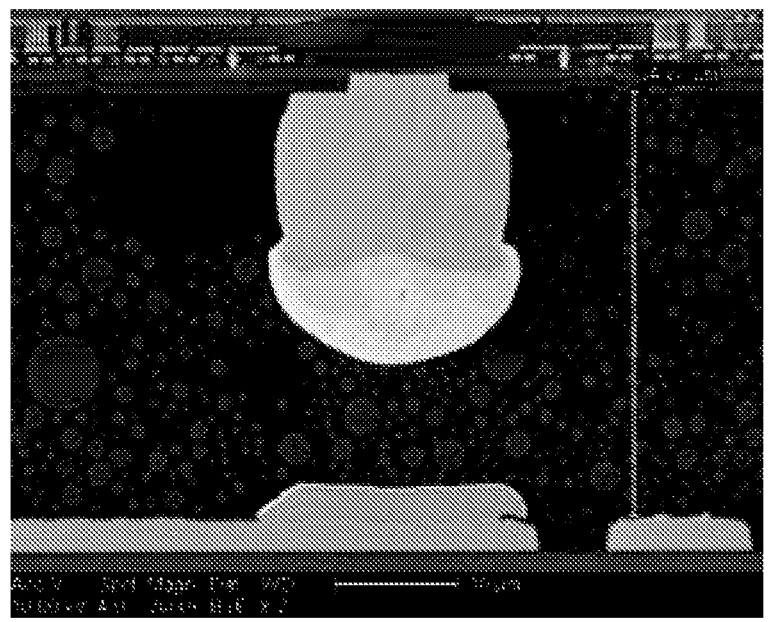

In Example 5, a fluxing-encapsulant material is used to bond a die to a package via the same TCB process in Example 1. The fluxing-encapsulant material is the same material as described in Example 1 except that an uncoated filler with native surface hydroxyl groups, which are reactive with the epoxy resin, was used. FIG. 10 is a side-view of a joint and the encapsulant of the TCB assembled package of Example 5. As shown, extreme filler entrapment results from reaction of the filler with the epoxy/curing agents causing early gelation.

Figure 11:
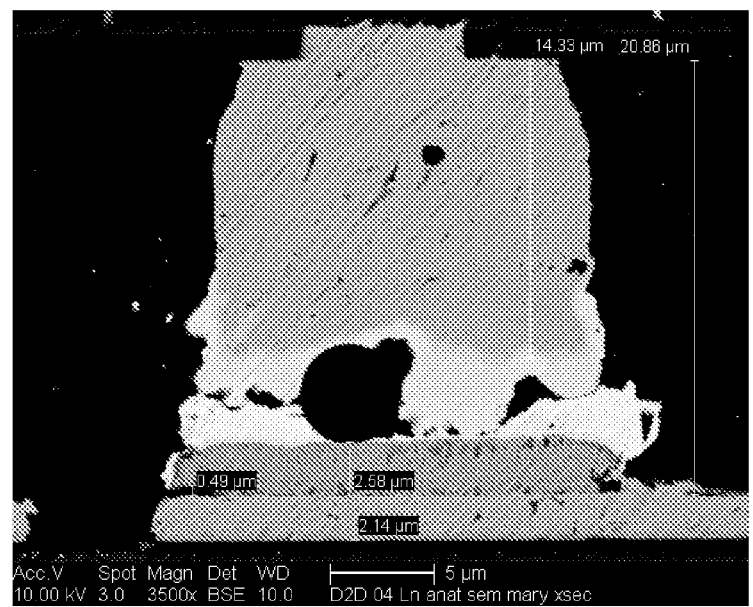

In Example 6, a fluxing-encapsulant material is used to bond a die to a package via the same TCB process in Example 1. The fluxing-encapsulant material is the same material as described in Example 1 except that a filler with larger particle size of approximately 24 microns was used. FIG. 11 is a side-view of a joint and the encapsulant of the TCB assembled package of Example 6. As shown, large filler size particles are entrapped in the joint leading to voids/bump cracks.

Referring back to FIG. 6B, non-reactive filler surface coatings of Example 1 show good joint formation and no filler entrapment. In addition, filler entrapment is avoided due to tailoring the filler size with respect to the dimensions of the joint.

Examples 7-8

Along with filler size/distribution and surface coating chemistry, bump geometry also plays a role in entrapment during TCB process. Hemispherical/dome shaped surfaced may help in pushing out fillers during TCB touchdown of the top die to the bottom bumps (or vice versa), whereas flat/recess shaped bumps typically show higher entrapment.

Figure 12:
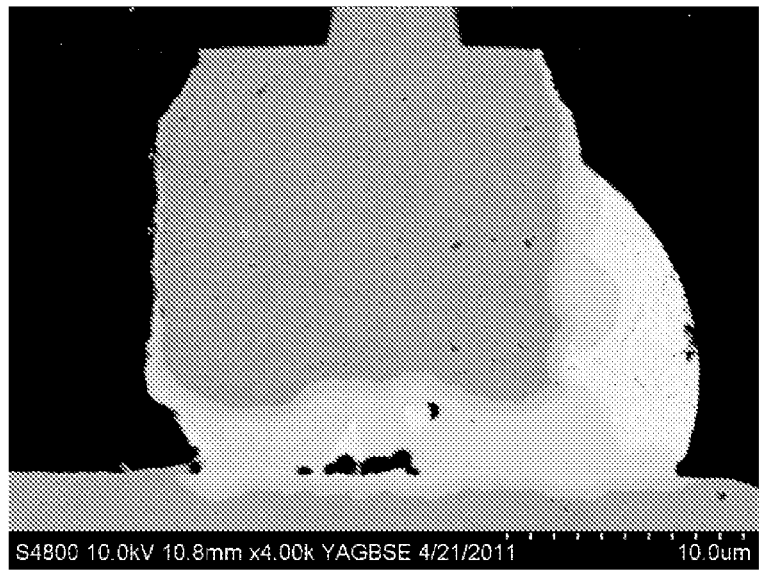
Figure 13:
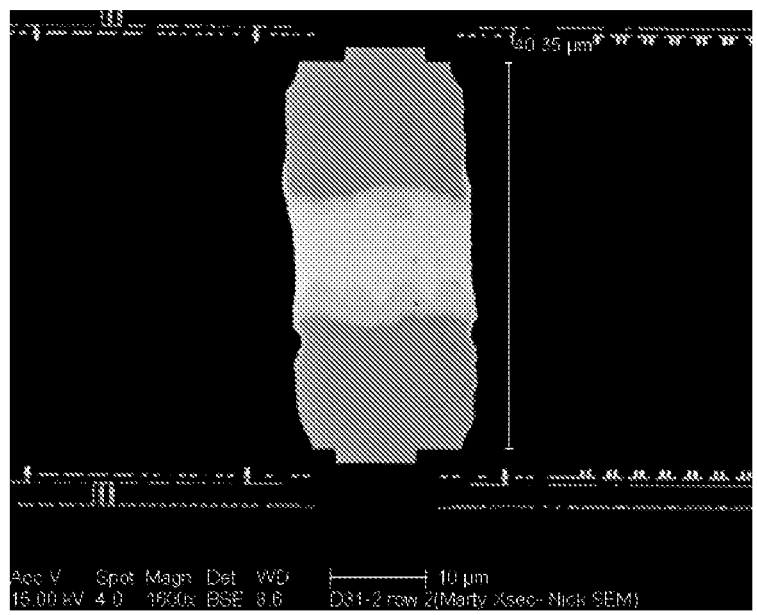

FIG. 12 is a side-view of a joint showing filler entrapment due to bottom recessed bump geometry. FIG. 13 is a side-view of a joint showing no filler entrapment due to the bottom bump being a hemispherical dome.

Figure 14:
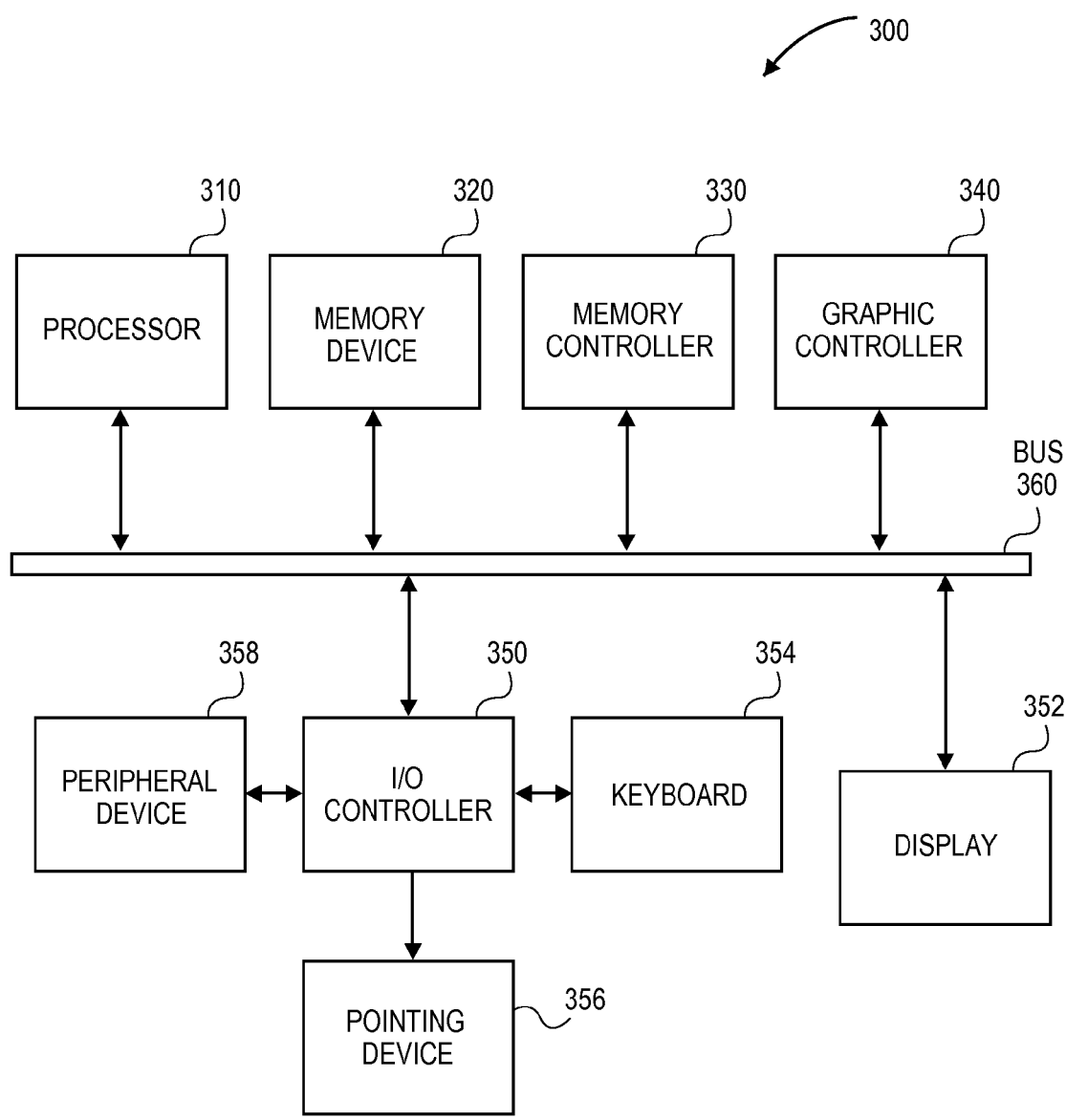
FIG. 14 represents a system in accordance with embodiments of the invention.

FIG. 14 shows a computer system according to an embodiment of the invention. System 300 includes a processor 310, a memory device 320, a memory controller 330, a graphics controller 340, an input and output (I/O) controller 350, a display 352, a keyboard 354, a pointing device 356, and a peripheral device 358, all of which may be communicatively coupled to each other through a bus 360, in some embodiments. Processor 310 may be a general purpose processor or an application specific integrated circuit (ASIC). I/O controller 350 may include a communication module for wired or wireless communication. Memory device 320 may be a dynamic random access memory (DRAM) device, a static random access memory (SRAM) device, a flash memory device, or a combination of these memory devices. Thus, in some embodiments, memory device 320 in system 300 does not have to include a DRAM device.

One or more of the components shown in system 300 may be included in/and or may include one or more packages, such as the thermal compression bonded package structure of FIG. 3D for example. For example, processor 310, or memory device 320, or at least a portion of I/O controller 350, or a combination of these components may be included in a package that includes at least one embodiment of a structure described in the various embodiments.

These elements perform their conventional functions well known in the art. In particular, memory device 320 may be used in some cases to provide long-term storage for the executable instructions for a method for forming packaged structures in accordance with embodiments of the present invention, and in other embodiments may be used to store on a shorter term basis the executable instructions of a method for forming package structures in accordance with embodiments of the present invention during execution by processor 310. In addition, the instructions may be stored, or otherwise associated with, machine accessible mediums communicatively coupled with the system, such as compact disk read only memories (CD-ROMs), digital versatile disks (DVDs), and floppy disks, carrier waves, and/or other propagated signals, for example. In one embodiment, memory device 320 may supply the processor 310 with the executable instructions for execution.

System 300 may include computers (e.g., desktops, laptops, hand-helds, servers, Web appliances, routers, etc.), wireless communication devices (e.g., cellular phones, cordless phones, pagers, personal digital assistants, etc.), computer-related peripherals (e.g., printers, scanners, monitors, etc.), entertainment devices (e.g., televisions, radios, stereos, tape and compact disc players, video cassette recorders, camcorders, digital cameras, MP3 (Motion Picture Experts Group, Audio Layer 3) players, video games, watches, etc.), and the like.

Although the present invention has been described in language specific to structural features and/or methodological acts, it is to be understood that the invention defined in the appended claims is not necessarily limited to the specific features or acts described. The specific features and acts disclosed are instead to be understood as particularly graceful implementations of the claimed invention useful for illustrating the present invention.

What is claimed is:

1. A method comprising:
   dispensing a fluxing-encapsulant material onto a bottom substrate which is secured to a pedestal;
   placing a top substrate onto the bottom substrate with a bond force, the top substrate secured to a bond head;
   ramping the bond head temperature to 250° C.-300° C. at a ramp rate of 50° C./second-100° C./second;
   maintaining the bond head temperature between 250° C.-300° C. for a period of time, wherein the fluxing-encapsulant material is substantially incompletely cured after maintaining the bond head temperature between 250° C.-300° C. for the period of time;
   reducing the bond head temperature to 180° C. or lower while the fluxing-encapsulant material is substantially incompletely cured; and
   subsequent to reducing the bond head temperature, performing a heat treatment to final cure the fluxing-encapsulant material.

2. The method of claim 1, wherein the fluxing-encapsulant material comprises:
   one or more epoxy resins having multiple functional groups and an epoxy equivalent weight (EEW) of 150-1,000;
   a curing agent having a functional group selected from the group consisting of anhydride, acid and amine; and
   a fluxing agent having a mono-carboxylic acid or di-carboxylic acid, and a pKa of 4-5.

3. The method of claim 2, wherein the one or more epoxy resins comprises a mixture of di-functional epoxy resin and tri-functional epoxy resin.

4. The method of claim 2, further comprising substantially completely curing the one or more epoxy resins to form a cured epoxy network, wherein reaction products of the fluxing agent do not phase separate from the cured epoxy network.

5. The method of claim 2, further comprising:
   forming a copper oxide on the top or bottom substrate while maintaining the top or bottom substrate at a temperature of 180° C. or less for up to 1 hour prior to placing the top substrate onto the bottom substrate;
   wherein the fluxing agent is capable of reducing copper oxide formed on the top or bottom substrate.

6. The method of claim 2, wherein a substantial portion of the curing agent reacts with the one or more epoxy resins between 250° C.-300° C.

7. The method of claim 2, wherein the bond head temperature is held above a liquidus temperature of a solder bump on the first or second substrate for 40 seconds or less.

8. The method of claim 2, wherein placing the top substrate onto the bottom substrate comprises placing a solder bump onto a copper pad.

9. The method of claim 2, further comprising fluxing an oxide layer from a copper pad when ramping the bond head temperature to 250° C.-300° C. at the ramp rate of 50° C./second-100° C./second.

10. The method of claim 2, further comprising:
    dispensing a fluxing-encapsulant material onto a plurality of bottom substrates which are secured to a pedestal;
    thermal compression bonding a top substrate onto each of the respective bottom substrates one at a time using the method comprising:
        placing a top substrate onto the bottom substrate, the top substrate secured to a bond head;
        ramping the bond head temperature to 250° C.-300° C. at a ramp rate of 50° C./second-100° C./second;
        maintaining the bond head temperature between 250° C.-300° C. for a period of time; and
        reducing the bond head temperature to 180° C. or lower.

11. A method comprising:
    dispensing a fluxing-encapsulant material onto a bottom substrate which is secured to a pedestal;
    holding the pedestal at a temperature in the range of 100° C.-180° C.;
    holding a bond head at a temperature in the range of 100° C.-180° C.;
    placing a top substrate onto the bottom substrate with a bond force, the top substrate secured to the bond head;
    ramping the bond head temperature from the temperature in the range of 100° C.-180° C. to 250° C.-300° C. at a ramp rate of 50° C./second-100° C./second;
    maintaining the bond head temperature between 250° C.-300° C. for 5-60 seconds; and
    reducing the bond head temperature to 180° C. or lower.

12. The method of claim 11:
    wherein the fluxing-encapsulant material is 40%-70% cured at the end of maintaining the bond head temperature between 250° C.-300° C. for 5-60 seconds; and
    wherein the fluxing-encapsulant material comprises:
        one or more epoxy resins having multiple functional groups and an epoxy equivalent weight (EEW) of 150-1,000;
        a curing agent having a functional group selected from the group consisting of anhydride, acid and amine; and
        a fluxing agent having a mono-carboxylic acid or di-carboxylic acid, and a pKa of 4-5.

\* \* \* \* \*